(12) United States Patent
Ohtani et al.

(10) Patent No.: US 7,058,468 B2
(45) Date of Patent: Jun. 6, 2006

(54) AUTOMATIC MATERIAL HANDLING SYSTEM, PRODUCTION SYSTEM FOR SEMICONDUCTOR DEVICE, AND PRODUCTION MANAGEMENT METHOD FOR SEMICONDUCTOR DEVICE

(75) Inventors: Hisashi Ohtani, Tochigi (JP); Eiichiro Tsuji, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 50 days.

(21) Appl. No.: 10/703,459

(22) Filed: Nov. 10, 2003

(65) Prior Publication Data
US 2004/0093108 A1    May 13, 2004

(30) Foreign Application Priority Data
Nov. 11, 2002    (JP)    ............................. 2002-326381

(51) Int. Cl.
  *G06F 19/00*    (2006.01)
(52) U.S. Cl. .................. 700/112; 700/95; 700/121; 414/217
(58) Field of Classification Search .............. 700/95, 700/96, 121, 217, 228, 112; 414/217
See application file for complete search history.

(56) References Cited

U.S. PATENT DOCUMENTS 6,517,304 B1 *   2/2003   Matsumoto ................ 414/217
6,547,953 B1 *   4/2003   Suzuki et al. .............. 205/765
6,558,962 B1 *   5/2003   Nishiki ......................... 438/5
6,770,109 B1 *   8/2004   Tanaka et al. ............ 55/385.6
6,795,745 B1 *   9/2004   Ueno et al. ................. 700/121
6,826,441 B1 * 11/2004   Yamagishi .................. 700/121

FOREIGN PATENT DOCUMENTS

JP    11-322068    11/1999

* cited by examiner

*Primary Examiner*—Leo Picard
*Assistant Examiner*—Sheela S. Rao
(74) *Attorney, Agent, or Firm*—Eric J. Robinson; Robinson Intellectual Property Law Office, P.C.

(57) ABSTRACT

It is an object to provide an AGV that enables preventing a substrate and a manufacturing system from being contaminated due to another substrate with an adhering contaminant generated in a manufacturing process, and also a production system for a semiconductor device and a production management method for a semiconductor device, which use the AGV.

In the present invention, air filtered through a filter is introduced into a containing portion of an AGV, and air in the containing portion containing a carrier is exhausted after filtering the air in the containing portion through another filter. As the filter used before discharging the air, a filter that enables filtering an impurity on the order of a submicron level is used. In addition, a carrier used before doping is changed to another carrier after doping, and CIM system is used to control driving of the AGV and selection of the carrier.

26 Claims, 9 Drawing Sheets

| No. | process | system | change of carrier |
|---|---|---|---|
| 1 | writing ID of substrate | laser marking system | × |
| 2 | cleaning substrate | cleaning equipment | × |
| 3 | forming base film | CVD system A | × |
| 4 | forming amorphous semiconductor film | CVD system A | × |
| 5 | thermal crystallization | annealer A | × |
| 6 | laser crystallization | laser system | × |
| 7 | forming insulating film for mask | CVD system B | × |
| 8 | B+ channel doping | doping system | ○(A→B) |
| 9 | etching (wet) insulating film for mask + cleaning substrate | etching system A + cleaning equipment | ○(B→A) |
| 10 | patterning to polycrystalline semiconductor film | pattern lithography system | × |
| 11 | etching (dry) polycrystalline semiconductor film | etching system C | × |
| 12 | resist stripping + cleaning substrate | resist-stripping system + cleaning equipment | × |
| 13 | forming gate insulating film | CVD system A | × |
| 14 | forming conductive film | sputtering system A | × |
| 15 | resist application | coater | × |
| 16 | exposure | exposure system | × |
| 17 | patterning to conductive film | pattern lithography system | × |
| 18 | resist baking | annealer B | × |
| 19 | etching (dry) conductive film | etching system D | × |
| 20 | heavy P doping | doping system | ○(A→C) |
| 21 | etching (dry) conductive film | etching system D | × |
| 22 | ashing | ashing system | × |
| 23 | resist stripping + cleaning substrate | resist-stripping system + cleaning equipment | ○(C→A) |
| 24 | light P doping | doping system | ○(A→C) |
| 25 | light B doping | doping system | ○(C→D) |
| 26 | heavy B doping | doping system | × |
| 27 | ashing | ashing system | × |
| 28 | resist stripping + cleaning substrate | resist-stripping system + cleaning equipment | ○(D→A) |
| 29 | forming 1st interlayer insulating film | CVD system B | × |
| 30 | thermal activation | annealing system C | × |

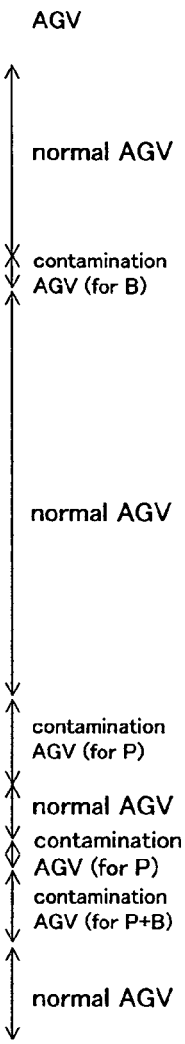

AGV normal AGV contamination AGV (for B)

normal AGV contamination AGV (for P)

normal AGV contamination AGV (for P)

contamination AGV (for P+B)

normal AGV

Fig. 9

AUTOMATIC MATERIAL HANDLING SYSTEM, PRODUCTION SYSTEM FOR SEMICONDUCTOR DEVICE, AND PRODUCTION MANAGEMENT METHOD FOR SEMICONDUCTOR DEVICE

BACKGROUND OF THE INVENTION

1. Field of the Invention

The present invention relates to an auto-guided vehicle (AGV) that transfers a substrate for forming a semiconductor device in a clean room. The present invention also relates to a production system and a production management method for a semiconductor device, for managing a production line that uses the AGV for a semiconductor device

2. Description of the Related Art

In a production line for a semiconductor device, a cleanliness level required for a clean room is varied depending on a degree of integration. In general, it is considered that a dust with a grain size that is equivalent to one tenth of a design rule or more has an influence on characteristics of a product, and a higher cleanliness level is required for a clean room with a higher degree of integration.

In order to obtain the higher cleanliness level, an AGV that automatically transfers a substrate between manufacturing systems in a clean room. With the automatic transfer by the AGV, a human body that is most a source of a dust can be kept as far away from the clean room as possible. Therefore, it is possible to the higher cleanliness level and to improve yield of a production. To the transferred substrate, a process for an object is performed in each manufacturing system.

In particular, in a production system called a job shop system, in which manufacturing systems of the same kind in a factory are put together into a group of equipments in a plant and a substrate that is an object to be processed is moved between the groups of equipments, the automatic transfer with the AGV is quite useful. In the case of a large-sized plant, not only a cleanliness level in a clean room can be improved but also an advantage of eliminating a loss of time due to waiting for an operator can also be obtained.

In general, the AGV performs transfer with containing one or plural carriers in which a substrate is stored. In a space (a containing portion) for containing the carrier in the AGV, air filtered through a filter provided with the AGV is introduced to keep a cleanliness level in the containing portion thereby (for example, Reference 1: Japanese Patent Laid-Open 11-322068).

By the way, a thin film transistor that is one of active devices, provided in a semiconductor device, is completed through various manufacturing processes, typically, which mainly include forming a base film for preventing penetration of an impurity in a substrate into a semiconductor film, forming and crystallizing the semiconductor film, patterning of the semiconductor film, forming a gate insulating film, forming a source/drain region, and forming a gate electrode.

For the process of forming the source/drain region in the processes above, doping with an impurity for imparting conductivity is performed to the semiconductor film. The doping includes ion implantation and thermal diffusion. In the case of imparting an n-type, an element that functions as a donor (an element of Group 15 such as P, As, or Sb, or an element of Group 16 such as S, Te, or Se) is used as a dopant to perform doping whereas an element that functions as an accepter (an element of Group 13 such as B, Al, Ga, or In, or an element of Group 12 such as Zn) is used as a dopant to perform doping in the case of imparting a p-type.

The dopant or a reaction product that adheres to the substrate in doping, however, is released into the atmosphere. Although an element as the impurity is necessary for forming the source/drain region, the impurity is a contaminant that becomes a cause of chemical contamination against the substrate in the process in a different manufacturing process, and it has an adverse affect on characteristics of the semiconductor device that the substrate is contaminated by the element.

For example, characteristics of a semiconductor device represented by a device such as a TFT are fluctuated, or in deposition with CVD, fluctuation in deposition rate is generated due to contamination of a surface on which a film is formed.

Since the substrate after doping is transferred with the AGV to a manufacturing system for the next process, there is the possibility that the atmosphere is contaminated by the impurity in a transfer route with the AGV as shown in Reference 1, which takes in once and exhausts air in a clean room in order to keep the substrate inside clean.

In addition, there is also concern about a harmful influence on a body of an operator working in the clean room due to diffusion of the impurity in the clean room.

SUMMARY OF THE INVENTION

In view of the above problems, it is an object of the present invention to provide an AGV that enables preventing a substrate and a manufacturing system from being contaminated due to another substrate with an adhering contaminant generated in a manufacturing process, and also a production system for a semiconductor device and a production management method for a semiconductor device, which use the AGV.

In the present invention, air filtered through a filter is introduced into a containing portion of an AGV, and air in the containing portion containing a carrier is exhausted after filtering the air in the containing portion through another filter. As the filter used before exhausting the air, a filter that enables filtering an impurity on the order of a submicron level is used.

With the configuration above, it is possible to reduce the amount of impurity contained in the exhaust air, and to prevent diffusion of the impurity in a transfer route.

Although it is necessary to pay attention to diffusion of an impurity from a substrate immediately after doping, it is considered that the diffusion of the impurity to the atmosphere can be suppressed when the substrate is cleaned or a film is deposited on the substrate after doping. Accordingly, in the present invention, an AGV used 1) after a process of doping and before a process of suppressing diffusion of an impurity to the atmosphere is different from that used 2) before the process of doping and 3) after the process of suppressing diffusion of the impurity to the atmosphere.

With the configuration above, it is possible to prevent a substrate at the stage 2) or 3) from being contaminated due to an impurity adhering to a containing portion of the AGV at the stage 1). Accordingly, it is possible to prevent manufacturing systems except a doping system from being contaminated by the impurity.

In the present invention additionally, a carrier for storing a substrate at the stage 1) is different from that at the stage 2) or 3). Furthermore, the carrier is changed depending on the kind of the impurity used in doping.

With the configuration above, contamination due to the impurity in the carrier can be prevented.

Besides, in the present invention, a system that integrates planning, designing, and manufacturing based on common data base, so-called CIM (Computer Integrated Manufacturing) system is used. When the CIM system is used, it is possible to all manage an AGV and a carrier used for a transfer between processes with a computer.

In the present invention, an AGV and a carrier can be surely managed when the CIM system is used. Accordingly, since it is possible to prevent a substrate and a manufacturing system from being contaminated by an impurity, it is possible to suppress degradation in characteristics and yield of a semiconductor device due to chemical contamination and to get rid of the concern about a harmful influence on a human body due to the impurity.

BREIF DESCRIPTION OF THE DRAWINGS

In the accompanying drawings:

FIG. 9 is a process sheet showing manufacturing processes of a semiconductor device.

DESCRIPTION OF THE PREFERRED EMBODIMENTS

Embodiment Mode

An explanation will be given with reference to FIGS. 1A and 1B on a configuration of an AGV used in a production system according to the present invention.

Figure 1A:
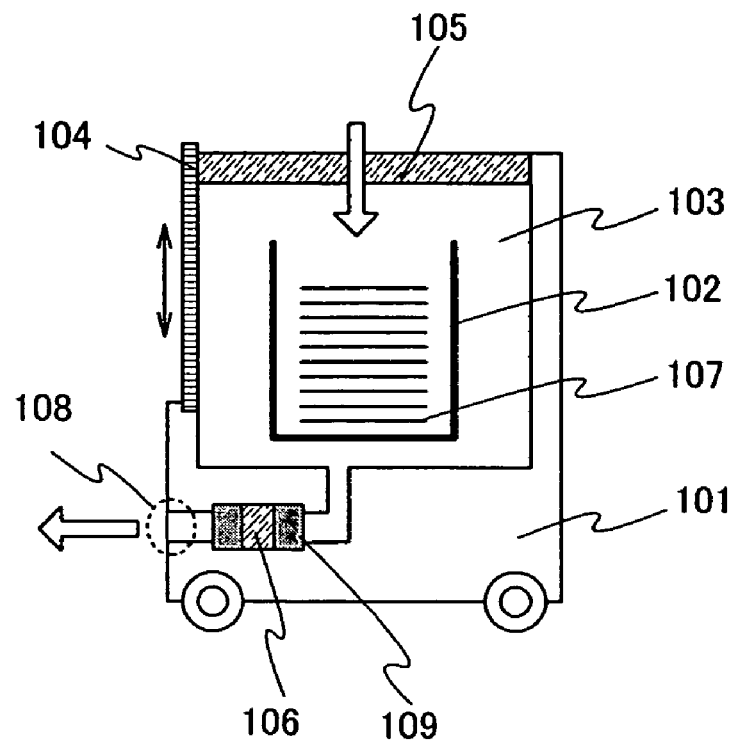
FIGS. 1A and 1B are diagrams showing a structure of an AGV according to the present invention.
Figure 1B:
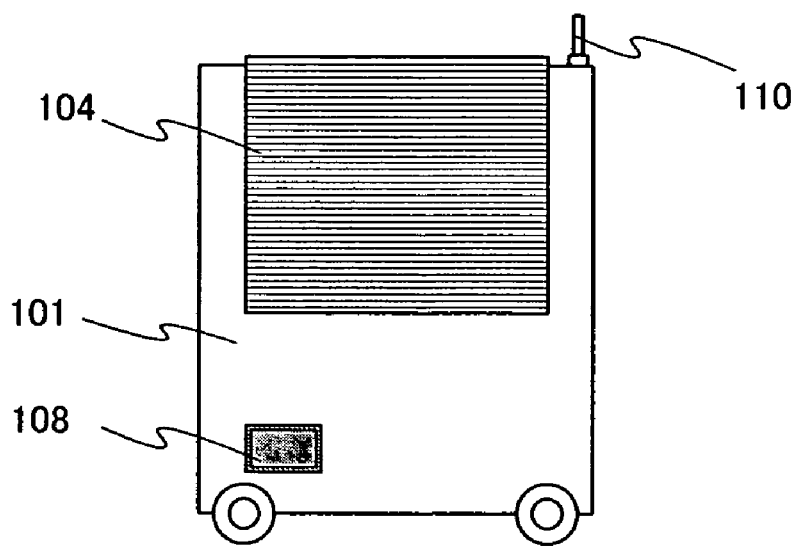

FIG. 1A shows a sectional view of the AGV and FIG. 1B shows an outline view. The AGV according to the present invention has a containing portion 103 provided in a vehicle body 101, which contains a carrier 102. With a shutter 104 closed, it is possible to separate an inside of the containing portion 103 from the surrounding in order not to expose the inside to the atmosphere.

It is possible to transfer the carrier 102 containing a substrate 107 into and from the containing portion 103 when the shutter 104 is open. The number of carriers contained in the containing portion 103 can be appropriately determined by a designer.

A filter 105 for intake air is provided for filtering air into the containing portion 103, and a filter 106 for exhaust air is provided for filtering air in the containing portion 103 to remove an impurity when the air is exhausted outside the AGV. With a pump 109, it is possible to control the air flow in the containing portion 103 so that air filtered through the filter 105 for intake air is taken in, made to pass through the inside of the containing portion 103, and again filtered through the filter 106 for exhaust air to be exhausted.

Although FIG. 1A shows the configuration in which the filter 106 for exhaust gas is incorporated into the pump 109 for exhaust, the filter 106 for exhaust gas and the pump 109 for exhaust may be provided to separate from each other.

The filter 105 for intake air is provided to prevent a minute dust from adhering to the substrate 107 by taking in the minute dust considered to exist in a clean room into the containing portion 103 together with intake air. Therefore, it is desired that the filter 105 for intake air enables removing at least a dust with a size considered to have an adverse influence on characteristics of a semiconductor device.

As the filter 105 for intake air, an ULPA filter or a HEPA filter can be used, for example.

On the other hand, the filter 106 for exhaust air is provided for preventing an impurity released from the substrate 107 from being exhausted into the clean room. Therefore, it is desired that the filter 106 for exhaust air enables removing at least the impurity released from the substrate 107.

As the filter 106 for exhaust air, a filter including cation exchange fiber that is ion exchange fiber as a filter medium, an ULPA filter, or a HEPA filter can be used, for example.

In addition, the AGV shown in FIGS. 1A and 1B has an antenna 110 to transmit and receive data between the AGV and the outside of the AGV with non-contact. It is not always necessary to transmit and receive data with non-contact, and the AGV may have a port provided for transmitting and receiving data between the AGV and another peripheral device, for example.

The AGV may also have a means for reading an I.D. number assigned to a carrier or a substrate. The I.D. number may include a letter, a mark, or a code such as bar code. Alternatively, an address may be assigned to each slot in a carrier to recognize each substrate with a combination of the address and an I.D. number of the carrier.

Besides, although the AGV shown in FIGS. 1A and 1B has the filter 105 for intake air provided above an exhaust outlet 108, the present invention is not limited to the configuration, and the filter 105 for intake air may be provided below the exhaust outlet 108. It is preferable to determine positions of the filter 105 for intake air and the exhaust outlet 108 in order to be able to take in air preferentially from a direction considered to have cleaner air in a clean room and exhaust the air to another direction that is different from the direction, in terms of maintenance of a cleanliness level in the clean room and the containing portion. In the case of a clean room with conditioning of a downflow type, for example, it is preferable to provide the filter 105 for intake air above the exhaust outlet 108 since air is considered to be cleaner above than below.

Concerning the pump of the AGV, the pump may be automatically driven at the start of transfer, may be automatically driven during containing a carrier, or may be driven when an instruction is given externally.

Although the air flow in the containing portion 103 is controlled with the pump in FIGS. 1A and 1B, a fan may be provided instead of the pump to control the air flow in the containing portion 103. Alternatively, the both of the pump and the fan may be provided.

Next, an explanation will be given on a production system that uses an AGV according to the present invention.

Figure 2:
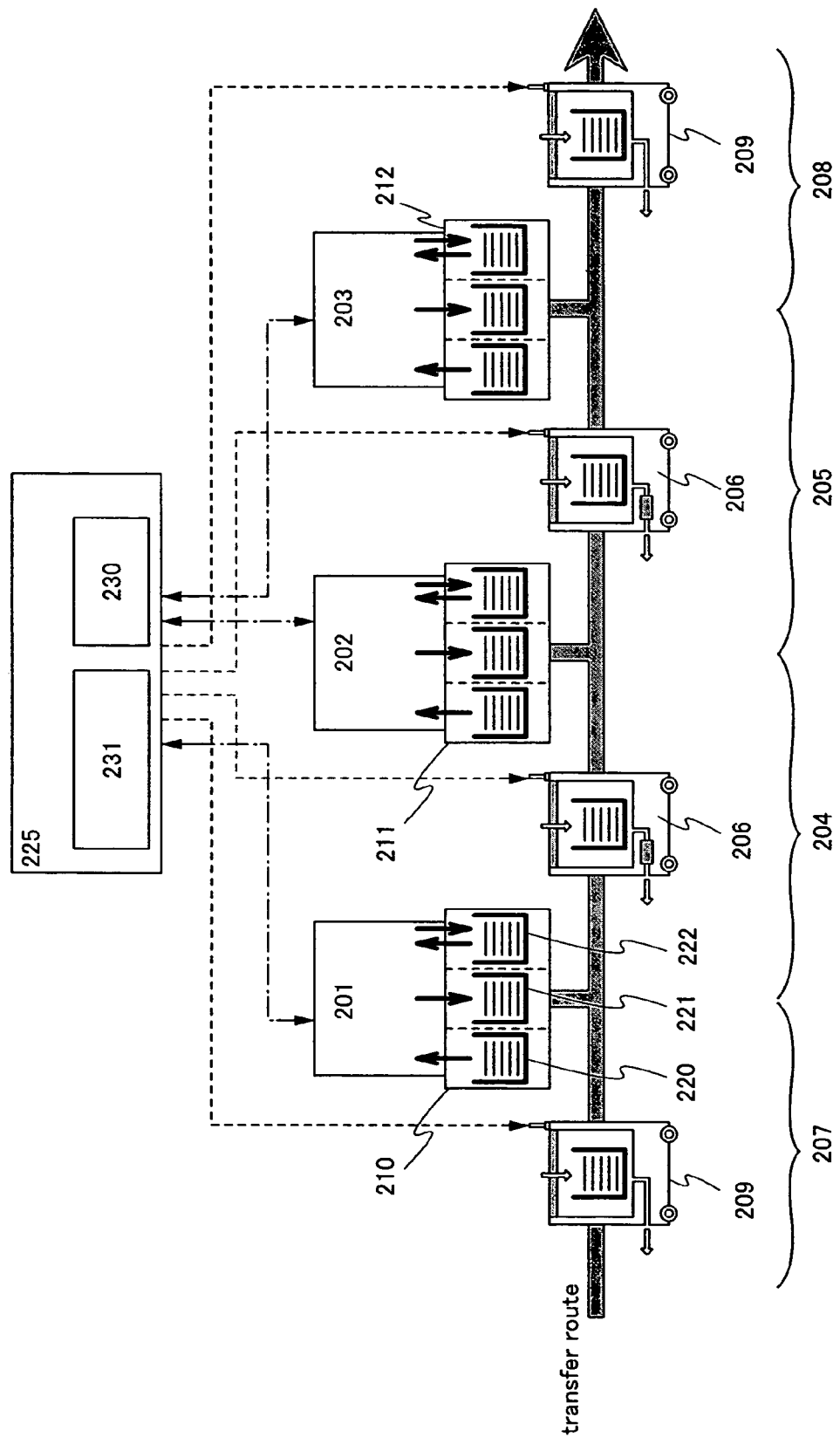
FIG. 2 is a diagram showing a conception of a production system according to the present invention.

FIG. 2, a conception of the production system according to the present invention is briefly shown. Hereinafter, in order to distinguish the AGV shown in FIGS. 1A and 1B according to the present invention from a normal AGV without a filter for exhaust air, the former is referred to as a contamination AGV whereas the latter is referred to as a normal AGV.

FIG. 2 shows a doping system 201, an ashing system 202, and a resist-stripping system 203. Here, an explanation will be given on the case of doping to a semiconductor film with resist as a mask in the doping system 201, ashing of the resist in the ashing system 202, and removing the resist after ashing in the resist-stripping system 203.

In the flow of the above-mentioned processes, it is in a transfer route 204 of a substrate from the doping system 201 to the ashing system 202 and a transfer route 205 of the substrate from the ashing system 202 to the resist-stripping system 203 that there is concern about diffusion of an impurity released from the substrate to the atmosphere. In the production system according to the present invention, the substrate is transferred with the use of a contamination AGV 206 in at least the transfer routes 204 and 205.

In transfer routes except the transfer routes 204 and 205, for example, in a transfer route 207 of the substrate from a manufacturing system used in the previous process to the doping system 201 and a transfer route 208 of the substrate from the resist-stripping system 203 to a manufacturing system used in the next process, it is assumed that there is no concern about the diffusion of the impurity form the substrate to the atmosphere. In this case, the substrate may be transferred with the use of a normal AGV 209 in the transfer routes 207 and 208. Even if it is assumed there is no problem of the diffusion of the impurity form the substrate to the atmosphere, it is not always necessary to use the normal AGV, and the contamination AGV may be of course used providing that the transfer routes 204 and 205 do not share the contamination AGV with the transfer routes 207 and 208.

With respect to each manufacturing system, carrier stations 210, 211, and 212 for containing a carrier temporarily are provided in order to hand over a carrier. A carrier transferred by an AGV is contained in the carrier station 210, 211, or 212, and is handed over to each manufacturing system. In this case, the carrier and a substrate therein may be handled over all together to each manufacturing system, or only the substrate contained in the carrier may be handled over.

In each manufacturing system, a process for an object is performed to the received substrate. After completing the process, the processed substrate is again contained in the carrier station 210, 211, or 212 with the carrier containing the substrate.

In the present invention, a substrate before processing is contained in a carrier that is different from a carrier for containing the substrate after the processing. Therefore, the carrier stations 210, 211, and 212 are made to enable containing both a carrier 220 for containing a substrate before processing and a carrier 221 for containing the substrate after processing.

In the case where it is unnecessary to distinguish between a carrier for containing a substrate before processing and a carrier for containing the substrate after processing, for example, in the case where it is assumed that diffusion of an impurity has no remarkable problem since a concentration in doping is extremely low, another carrier 222, other than the carriers 220 and 221, may be used so that the carrier 222 can also be contained in the carrier station 210, 211, or 212.

In addition, in the present invention, not shown in FIG. 2, a different carrier containing a substrate is used with respect to each kind of an impurity used as a dopant. For example, a different carrier may be used with respect to each of an impurity for imparting an n-type and an impurity for imparting a p-type, or with respect to each of the kinds of elements with the same polarity.

The appropriate use of a carrier, as mentioned above, is not always necessary for all manufacturing systems. In the case where there is concern about diffusion both of an impurity from a substrate transferred to a manufacturing system and an impurity from a substrate transferred from the manufacturing system, for example, in the case of the ashing system 202 in FIG. 2, a carrier may be shared. In the case where it is assumed that there is no concern about diffusion of an impurity from either a substrate transferred to a manufacturing system or a substrate transferred from the manufacturing system, a carrier may also be shared.

In FIG. 2, a host computer 225 for managing a production system controls transferring a carrier with the use of the AGV.

In the case of FIG. 2, the host computer 225 has a memory 230 provided for storing data of the transfer routes 204 and 205 of the contamination AGV, among all transfer routes of a carrier among plural manufacturing systems, and each of the specific manufacturing systems 201 and 203, in which a carrier before processing is changed to another carrier after processing. In addition, a CPU 231 is also provided in the host computer 225 for generating a signal that indicates, to the contamination AGV, the transfer along each of the transfer routes 204 and 205 and also for generating a signal that indicates, to each of the specific manufacturing systems 201 and 203, the change of a carrier to another carrier.

The present invention is not limited to the control as shown in FIG. 2, in which the host computer 225 controls the transfer of a carrier with the use of the AGV. The transfer with the use of the AGV may be controlled by each manufacturing system, or alternatively, a sub-computer that is able to exchange data with the host computer 225 may be provided to control the transfer with the use of the AGV.

Figure 3A:
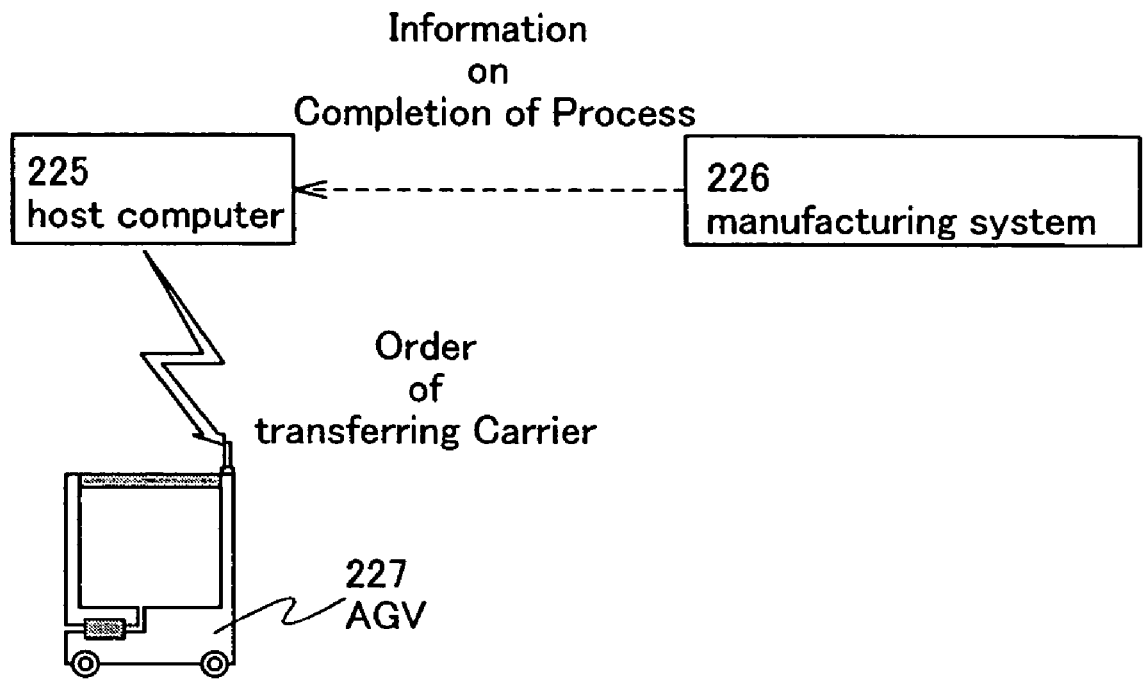
FIGS. 3A and 3B are a signal flow diagram and a signal flow chart.
Figure 3B:
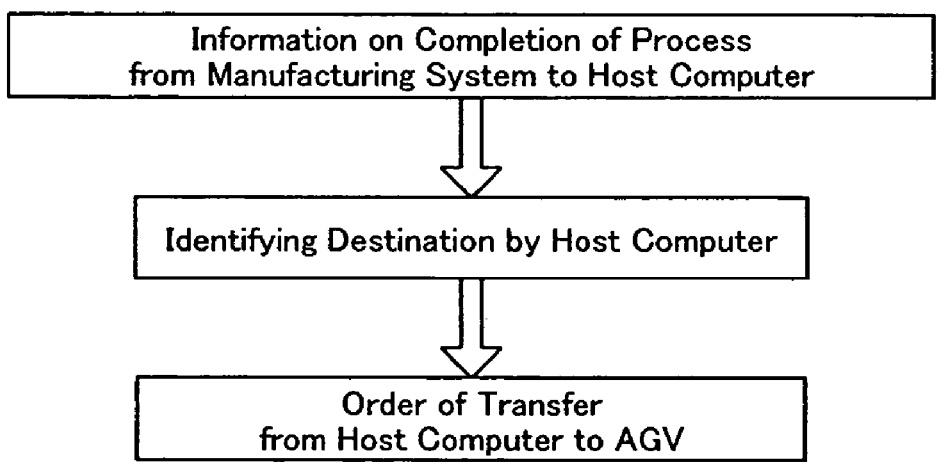

With reference to FIGS. 3A and 3B, signal flow in a production system according to the present invention will be briefly explained. FIG. 3A briefly shows a signal flow among the host computer 225, a manufacturing system 226, and an AGV 227, and FIG. 3B shows a flow chart of the signal flow in FIG. 3A. The manufacturing system 226 shown in FIGS. 3A to 6C includes the doping system 201, the ashing system 202, and the resist-stripping system 203 that are shown in FIG. 2, and other manufacturing system. The AGV 227 includes the contamination AGV 206 and the normal AGV 209.

In FIG. 3A, when a process for an object is completed in the manufacturing system 226, the host computer 225 is informed of the completion of the process from the manufacturing system 226. At this moment, information for identifying which manufacturing system is used and which carrier is processed, for example, an I.D. number of the manufacturing system and an I.D. number of the carrier, may be transmitted in addition to the information on the completion of the process.

When the host computer 225 is given the information on the completion of the process, a destination of the carrier (where the carrier is transferred) is identified with reference to a process sheet. At this moment, the contamination AGV or the normal AGV is selected as the AGV 227 to be used for the transfer with reference to the process sheet.

Then, the host computer 225 orders the selected AGV 227 to transfer the carrier to the identified destination. When the AGV 227 is given the instructions of the transfer, the carrier is transferred to the specified destination. In the case where plural carriers to be transferred are contained in a carrier station, information for identifying the carriers to be transferred may be transmitted to the AGV 227.

In the case where a carrier transferred from a manufacturing system has always one destination, it is not necessary to specify the destination, and what the AGV 227 is informed of is only timing of a transfer.

Figure 4A:
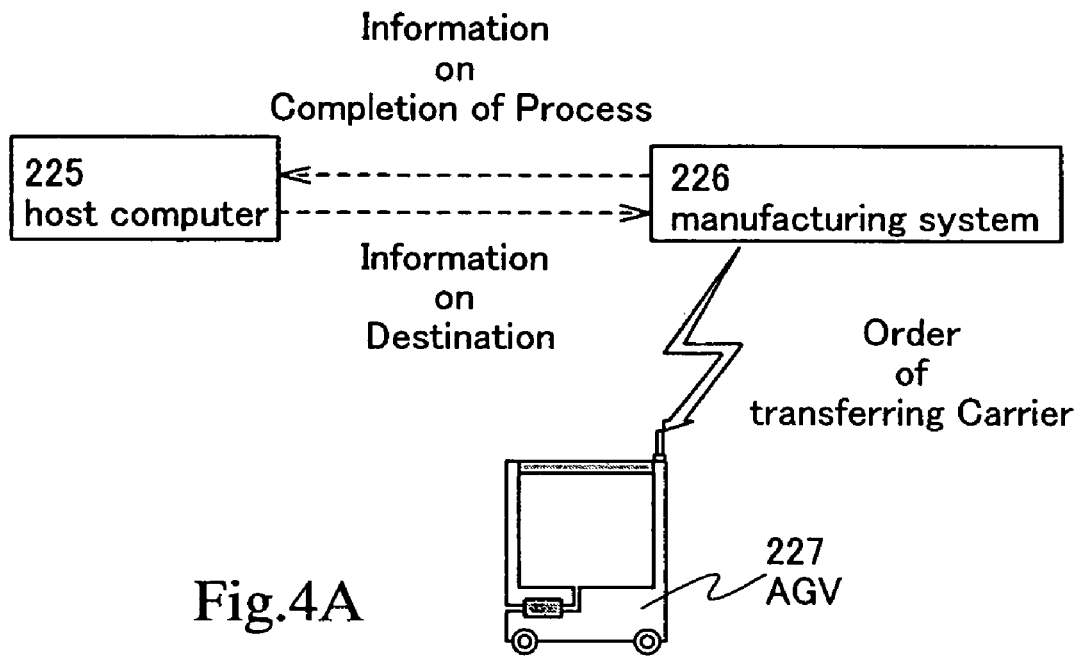
FIGS. 4A and 4B are a signal flow diagram and a signal flow chart.
Figure 4B:
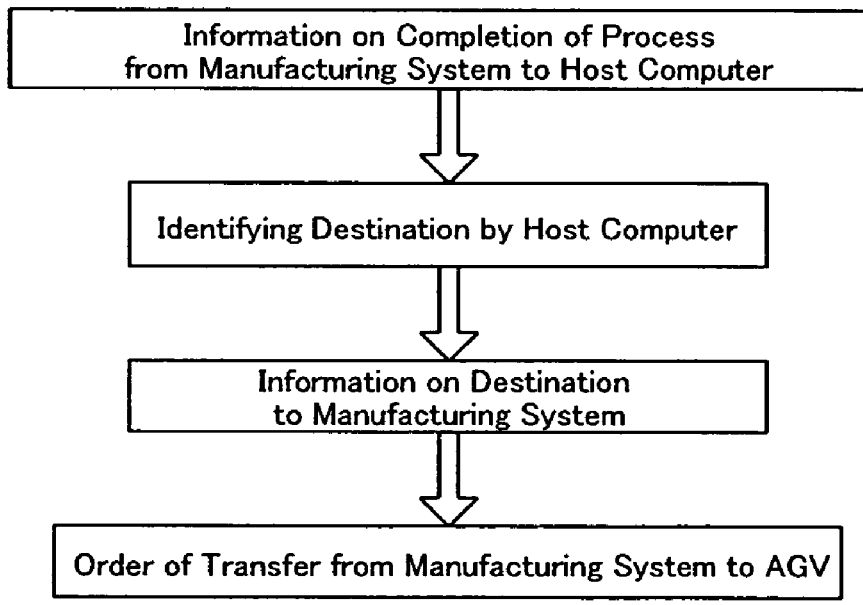

Next, with reference to FIGS. 4A and 4B, another example of a signal flow in a production system according to the present invention will be briefly explained. FIG. 4A briefly shows a signal flow among the host computer 225, the manufacturing system 226, and the AGV 227, and FIG. 4B shows a flow chart of the signal flow in FIG. 4A.

In FIG. 4A, when a process for an object is completed in the manufacturing system 226, the host computer 225 is informed of the completion of the process from the manufacturing system 226. At this moment, information for identifying which manufacturing system is used and which carrier is processed, for example, an I.D. number of the manufacturing system and an I.D. number of the carrier, may be transmitted in addition to the information on the completion of the process.

When the host computer 225 is given the information on the completion of the process, a destination of the carrier (where the carrier is transferred) is identified with reference to a process sheet. Then, the host computer 225 informs the manufacturing system 226 of the destination of the carrier.

The manufacturing system 226 orders the AGV 227 to transfer the carrier to the identified destination. The contamination AGV or the normal AGV as the AGV 227 may be selected by the host computer 225 with reference to a process sheet to inform the manufacturing system 226, or may be selected by the manufacturing system 226. In the case of selecting by the manufacturing system 226, a carrier contained in a specific section in a carrier station may be always transferred with the use of a specific AGV, for example.

When the AGV 227 is given the instructions of the transfer, the carrier is transferred to the specified destination. In the case where plural carriers to be transferred are contained in a carrier station, information for identifying the carriers to be transferred may be transmitted to the AGV 227.

In the case where a carrier transferred from a manufacturing system always has one destination, the destination need not be identified each time by the host computer since it is not necessary to specify the destination. In this case, it is simple that the instructions are given directly to the AGV 227 from the manufacturing system 226, as shown in FIGS. 4A and 4B, which has less loss of time. Besides, an amount of information of data exchanged with the host computer 225 can be reduced as much as possible, and thereby it is possible to reduce a load of the host computer and to prevent errors in transmitting and receiving data.

Figure 5A:
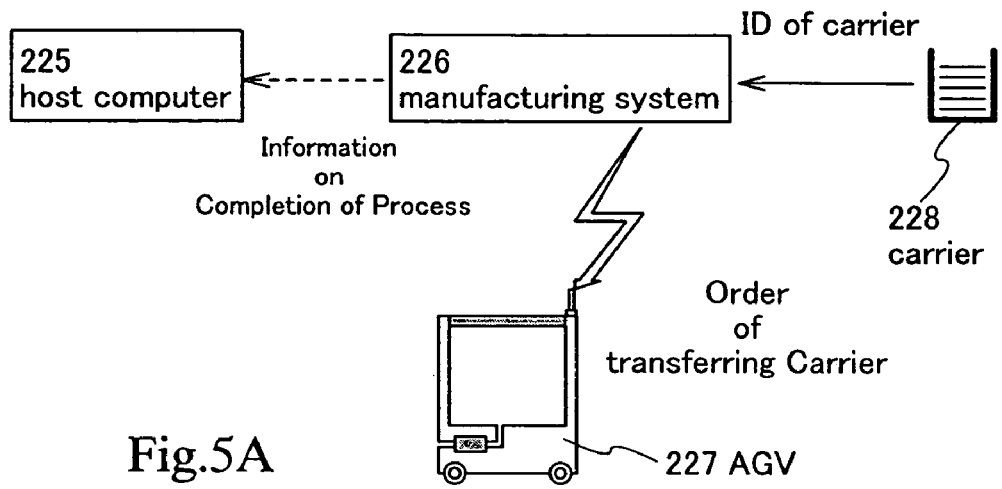
FIGS. 5A and 5B are a signal flow diagram and a signal flow chart.
Figure 5B:
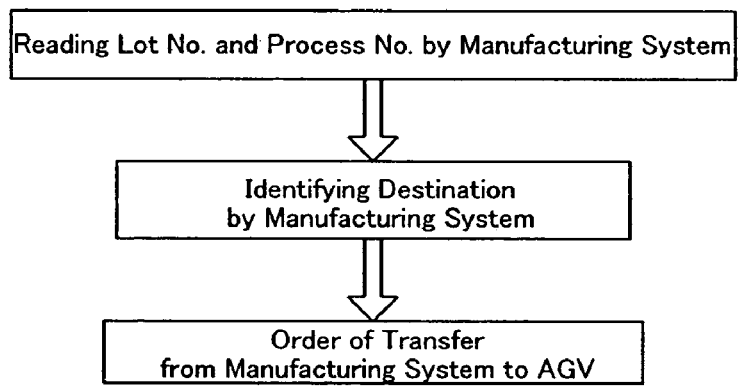

Next, with reference to FIGS. 5A and 5B, another example of a signal flow in a production system according to the present invention will be briefly explained. FIG. 5A briefly shows a signal flow among the host computer 225, the manufacturing system 226, the AGV 227, and a carrier 228 including the carrier 220 to 222 shown in FIG. 2. FIG. 5B shows a flow chart of the signal flow in FIG. 5A.

Although information for identifying a carrier can be transmitted from a host computer to a manufacturing system when the carrier is transferred, information of the carrier 228 is directly read in the case of FIG. 5A. The carrier 228 in FIG. 5A has the information held with a readable state, which enables identifying the carrier 228. The information is read in the manufacturing system 226 to identify the carrier 228.

When a process for an object is completed in the manufacturing system 226, the host computer 225 is informed of the completion of the process from the manufacturing system 226. At this moment, information for identifying which manufacturing system is used and which carrier is processed, for example, an I.D. number of the manufacturing system and an I.D. number of the carrier, may be transmitted in addition to the information on the completion of the process.

In the manufacturing system 226, data on a process sheet is also held. The manufacturing system 226 checks an I.D. number of the carrier 228 with the process sheet to identify a destination of the carrier 228, and orders the AGV 227 to transfer the carrier 228 to the identified destination. The contamination AGV or the normal AGV as the AGV 227 can be selected by the manufacturing system 226 with reference to the process sheet. The AGV 227 can be selected without reference to the process sheet, for example, when a carrier contained in a specific section in a carrier station is transferred always with the use of a specific AGV.

When the AGV 227 is given the instructions of the transfer, the carrier is transferred to the specified destination. In the case where plural carriers to be transferred are contained in a carrier station, information for identifying the carriers to be transferred may be transmitted to the AGV 227.

When the instructions of the transfer is given directly to the AGV 227 from the manufacturing system 226 as shown in FIGS. 5A and 5B, an amount of information of data exchanged with the host computer 225 can be reduced as much as possible, and thereby it is possible to reduce a load of the host computer and to prevent errors in transmitting and receiving data.

Although the information used for identifying the carrier 228 is read in the manufacturing system 226 in FIGS. 5A and 5B, the present invention is not limited thereto. For example, the information used for identifying the carrier 228 may be read by the AGV 227 to transmit the read information to the manufacturing system 226.

Figure 6A:
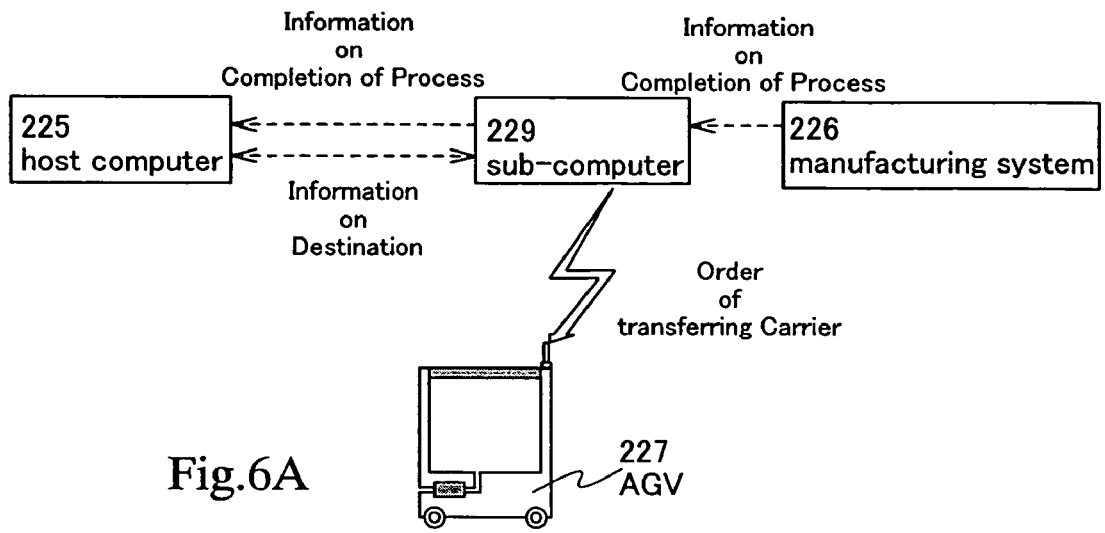
FIGS. 6A to 6C are a signal flow diagram and signal flow charts.
Figure 6B:
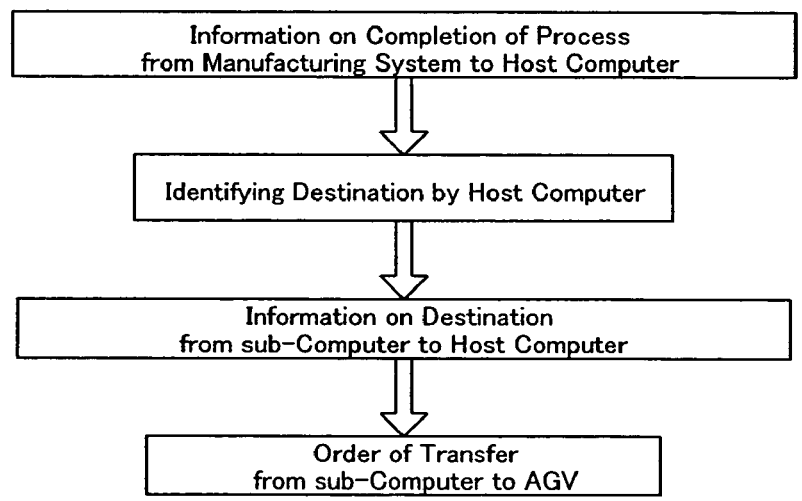
Figure 6C:
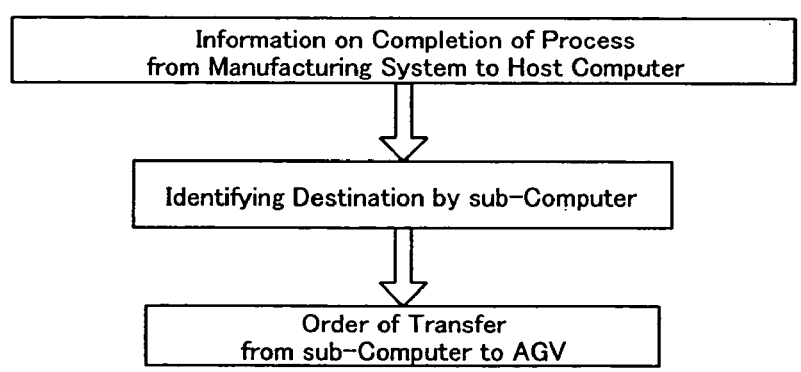

Next, with reference to FIGS. 6A and 6C, another example of a signal flow in a production system according to the present invention will be briefly explained. FIG. 6A briefly shows a signal flow among the host computer 225, the manufacturing system 226, the AGV 227, and a sub-computer 229, and FIG. 6B shows a flow chart of the signal flow in FIG. 6A.

In the case of FIG. 6A, when a process for an object is completed in the manufacturing system 226, the host computer 225 is informed of the completion of the process from the manufacturing system 226.

Although information on the completion of the process is transmitted through the sub-computer 229 in FIG. 6A, the host computer 225 may be informed directly. At this moment, information for identifying which manufacturing system is used and which carrier is processed, for example, an I.D. number of the manufacturing system and an I.D. number of the carrier, may be transmitted in addition to the information on the completion of the process.

When the host computer 225 is given the information on the completion of the process, a destination of the carrier (where the carrier is transferred) is identified with reference to a process sheet. At this moment, the contamination AGV or the normal AGV is selected as the AGV 227 to be used for the transfer with reference to the process sheet.

Then, the host computer 225 informs the sub-computer 229 of the destination and the AGV 227 to be selected, and the sub-computer 229 orders the AGV 227 to transfer the carrier to the identified destination. When the AGV 227 is given the instructions of the transfer, the carrier is transferred to the specified destination. In the case where plural carriers to be transferred are contained in a carrier station, information for identifying the carriers to be transferred may be transmitted to the AGV 227.

In the case where a carrier transferred from a manufacturing system has always one destination, it is not necessary to specify the destination, and what the AGV 227 is informed of is only timing of a transfer.

The contamination AGV or the normal AGV as the AGV 227 may be selected by the sub-computer 229. In the case of selecting by the sub-computer 229, a carrier contained in a specific section in a carrier station may be always transferred with the use of a specific AGV, for example.

Although the destination and the AGV 227 to be selected are identified by the host computer 225 in the case of FIGS. 6A and 6B, the sub-computer 229 may have the process sheet held as data to select the destination and the AGV 227 with reference to the process sheet, and FIG. 6C briefly shows another signal flow among the host computer 225, the manufacturing system 226, the AGV 227, and the sub-computer 229. In the case of FIG. 6C, an amount of information of data exchanged between the host computer 225 and the sub-computer 229 can be reduced as much as possible, and thereby it is possible to reduce a load of the host computer 225 and to prevent errors in transmitting and receiving data.

In any case of FIGS. 3A to 6C, the manufacturing system, the host computer, or the sub-computer, which ordered the transfer, may be informed accordingly when the transfer is completed. In addition, the AGV may stand by for the next order or may be charged before the next order is given. Alternatively, the AGV may be automatically returned back.

Besides, although substrates are managed by a carrier with the host computer, the sub-computer, or the AGV in FIGS. 3A to 6C, an I.D. number may be assigned with respect to each substrate to manage substrates by a substrate.

In fact, there are plural process sheets, and it is necessary to select one form the plural process sheets in accordance with the corresponding lot. The selection of the process sheet may be conducted by the manufacturing system, the host computer, or the sub-computer.

In the case where a substrate is rejected as being substandard, a carrier containing the substrate may be taken out of a production line.

Next, a manufacturing process of an n-channel TFT and a p-channel TFT will be given as an example to explain how to use a carrier appropriately.

Figure 7:
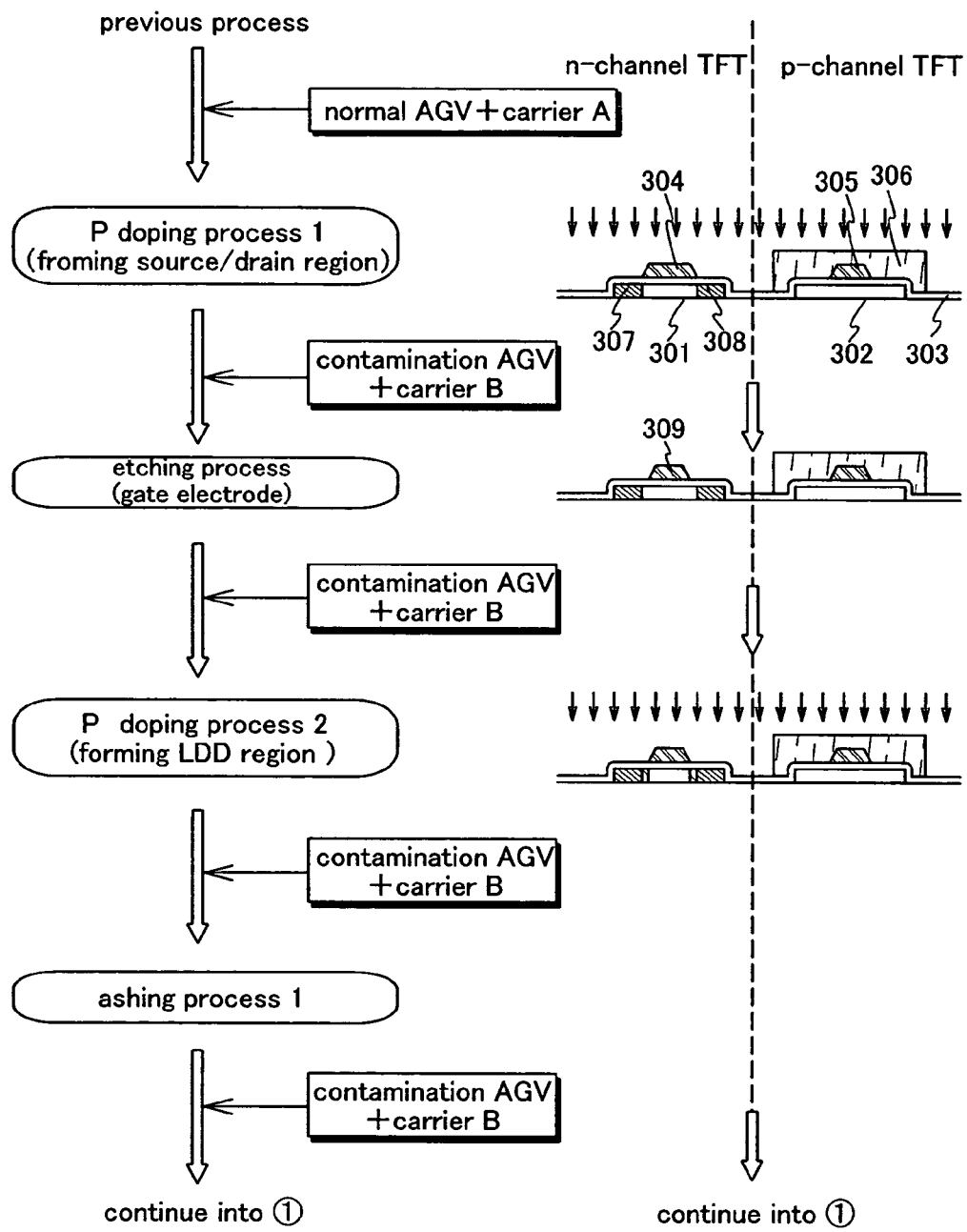
FIG. 7 is a diagram showing a flow chart of manufacturing process of an n-channel TFT and a p-channel TFT and a structure of a section of a substrate corresponding to the flow chart.
Figure 8:
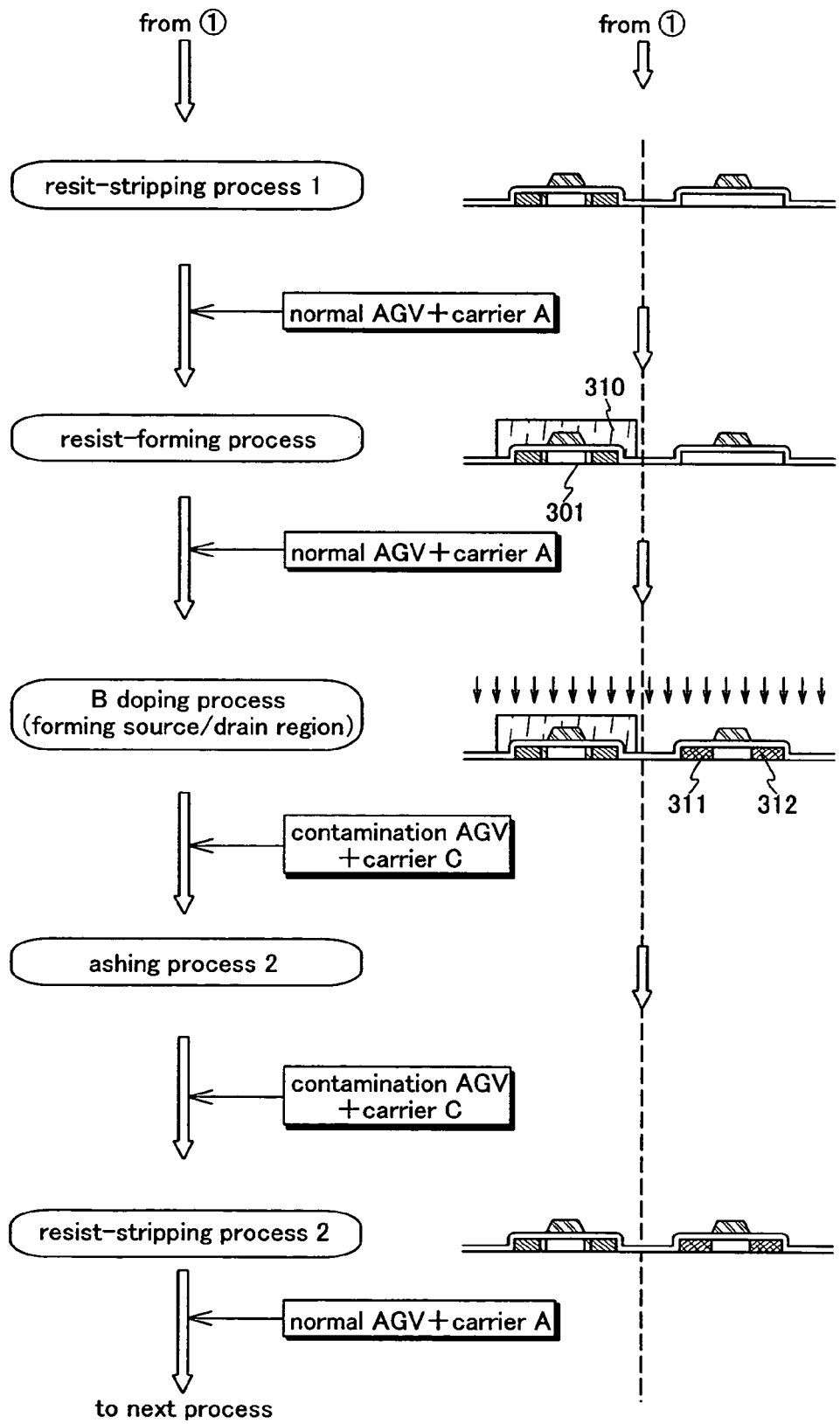
FIG. 8 is a diagram showing a flow chart of the manufacturing process of the n-channel TFT and the p-channel TFT and a structure of a section of the substrate corresponding to the flow chart.

FIGS. 7 and 8 show a flow chart of the manufacturing process of the n-channel TFT and the p-channel TFT and a structure of a section of a substrate corresponding to the flow chart. With reference to FIGS. 7 and 8, an explanation will be given on processes after processes of subjecting a semiconductor film to patterning to form an active layer 301 for the n-channel TFT and an active layer 302 for the p-channel TFT, forming a gate insulating film 303 to cover the active layers 301 and 302, forming gate electrodes 304 and 305 on the gate insulating film 303, and forming a mask 306 for doping with P, more specifically, on a series of processes from doping with P to stripping of resist used as a mask in doping with B.

First, as shown in FIG. 7, a substrate is contained in a carrier A and the carrier A is transferred to a doping system for P with the use of a normal AGV.

Then, the carrier A is contained in a carrier station of the doping system for P, and doping with P is performed. The active layer 302 is covered with the mask 306, and source/drain regions 307 and 308 are formed in the active layer 301 by doping with P.

Since there is concern about diffusion of an impurity from the substrate after doping, the substrate is moved into a carrier B and transferred to an etching system with the use of a contamination AGV.

In the etching system, the gate electrode 304 is subjected to anisotropic etching to become smaller. In order to distinguish before and after etching, the gate electrode 304 after etching is shown as a gate electrode 309 here.

Since there is still concern about diffusion of an impurity also from the substrate after etching as well as before etching, the substrate is contained in the carrier B and transferred again to the doping system for P with the use of the contamination AGV Then, in the doping system for P, doping is performed to the active layer 301 so that a concentration of an impurity in the doping is lower than that in the precious. doping, and an LDD region is formed in the active layer 301.

Since there is concern about diffusion of an impurity from the substrate after doping, the substrate is contained in the carrier B and transferred again to an ashing system with the use of the contamination AGV.

In the ashing system, ashing is performed to the transferred substrate in order to remove a surface of the mask 306, which is deformed due to doping.

Since there is still concern about diffusion of an impurity from the substrate after ashing as well as before ashing, the substrate is contained in the carrier B and transferred to a resist-stripping system with the use of the contamination AGV.

In the resist-stripping system, the mask, which has the surface removed with ashing, is completely removed with wet etching. When wet etching is performed after removing the deformed surface with ashing, it is possible to prevent residue of the mask from being generated and also prevent a portion other than the surface of the mask, for example, a surface of the gate insulating film, from being removed due to ashing. After conducting wet etching, cleaning of the substrate is conducted in a cleaning system provided with the resist-stripping system.

Since it is assumed that there is no concern about diffusion of an impurity from the substrate dried after cleaning, the substrate is moved into the carrier A, and transferred to a system for forming resist with the use of the normal AGV.

For the substrate transferred to the system for forming resist, a mask 310 for doping with B is formed. Although processes such as coating of resist, development by exposure, and baking are conducted to form the mask for real, it is assumed here that all systems for the processes are provided and all the processes are completed to form the mask 310 for B. The active layer 301 is covered with the mask 310.

Since it is assumed that there is no concern about diffusion of an impurity from the substrate after forming the mask 310, the substrate is contained the carrier A, and transferred to a doping system for B with the use of the normal AGV.

When doping with B is performed to the active layer 302 in the doping system for B, source/drain regions 311 and 312 for the p-channel TFT are formed.

Since there is concern about diffusion of an impurity from the substrate after doping with B, in which the kind of the dopant is different form that in the previous doping, the substrate is moved into a carrier C and transferred to an ashing system with the use of a contamination AGV. It is desired that the contamination AGV used in transferring the substrate after doping with B is different from the contamination AGV for transferring the substrate after doping with P. In order to distinguish the contamination AGV used after doping with B from the contamination AGV used after doping with P, the contamination AGV used after doping with B is referred to as a contamination AGV for B here.

In the ashing system, ashing is performed to the transferred substrate in order to remove a surface of the mask 310, which is deformed due to doping.

Since there is still concern about diffusion of an impurity from the substrate after ashing as well as before ashing, the substrate is contained in the carrier C and transferred to a resist-stripping system with the use of the contamination AGV for B.

In the resist-stripping system, the mask, which has the surface removed with ashing, is completely removed with wet etching. After conducting wet etching, cleaning of the substrate is conducted in a cleaning system provided with the resist-stripping system.

Since it is assumed that there is no concern about diffusion of an impurity from the substrate dried after cleaning, the substrate is moved into the carrier A, and transferred to a manufacturing system for the next process with the use of the normal AGV.

Although the process in the resist-stripping system is performed after the process in the ashing system to remove the resist in the case of FIGS. 7 and 8, the present invention is not limited thereto. It is possible to remove the resist only in the ashing system or only in the resist-stripping system. Alternatively, it is possible to perform the process in the ashing system after the process in the resist-stripping system. In any case, it is assumed that there is concern about diffusion of an impurity from the substrate until the process in the resist-stripping system is completed. Therefore, the contamination AGV is used in transferring the substrate until the process in the resist-stripping system is completed after the doping process.

The series of processes shown in FIGS. 7 and 8 are just an example of a manufacturing process of a semiconductor device produced in accordance with a production system according to the present invention, and the present invention is not limited thereto.

In the present invention, air filtered through a filter is introduced into a containing portion of an AGV, and the air in the containing portion containing a carrier is exhausted after filtering the air through another filter. Accordingly, it is possible to reduce the amount of impurity contained in the exhaust air, and to prevent diffusion of the impurity in a transfer route.

In addition, an AGV used 1) after a process of doping and before a process of suppressing diffusion of an impurity to the atmosphere is different from that used 2) before the process of doping and 3) after the process of suppressing diffusion of the impurity to the atmosphere. Accordingly, it is possible to prevent a substrate at the stage 2) or 3) from being contaminated due to an impurity adhering to a containing portion of the AGV at the stage 1), and, as the result, to prevent manufacturing systems except a doping system from being contaminated by the impurity.

Besides, a carrier for storing a substrate at the stage 1) is different from that at the stage 2) or 3) in the present invention. Accordingly, contamination due to an impurity in a carrier can be prevented.

Furthermore, an AGV and a carrier can be surely managed when the CIM system is used in the present invention. Accordingly, since it is possible to prevent a substrate and a manufacturing system from being contaminated by an impurity, it is possible to suppress degradation in characteristics and yield of a semiconductor device due to chemical contamination and to get rid of the concern about a harmful influence on a human body due to the impurity.

Although the present invention is used in the present embodiment mode for preventing diffusion of an impurity in doping, there is no limitation of the present invention to doping. In the case of concerning diffusion of a contaminant from a substrate to the atmosphere after a process other than doping, a production system and a production management method according to the present invention may be used in order to prevent diffusion of the contaminant.

The above-mentioned auto-guided vehicle, production system for a semiconductor device, and production management method for a semiconductor device, according to the present invention, can be used in a production line for an integrated circuit or semiconductor display device, in particular, in a production line or a management method of the production line for a device such as a liquid crystal display device, a light emitting device provided with a light emitting element represented by an organic light emitting element in each pixel, a DMD (Digital Micromirror Device), a PDP (Plasma Display Panel), or an FED (Field Emission Display), which manages, by lot, a large number of substrates to be subjected to sheet processing.

Embodiment

Hereinafter, an embodiment according to the present invention will be explained.

In the present embodiment mode, an explanation will be given on the content of a process sheet held as data in the memory 230 provided in the host computer 225 in the production system shown in FIG. 2.

In the case of controlling a transfer of a carrier with the use of an AGV by the host computer 225 as shown in FIG. 2, the memory 230 has information held as data on transfer routes of the contamination AGV, among all transfer routes of a carrier among plural manufacturing systems, and each of specific manufacturing systems or processes, for which a carrier before processing is changed to another carrier after processing.

FIG. 9 shows a process sheet for a manufacturing process of a semiconductor device that has an n-channel TFT and a p-channel TFT. In accordance with the process sheet shown in FIG. 9, a carrier is changed in each of manufacturing systems corresponding to process numbers 8, 9, 20, 23, 24, 25, and 28. In transfer routes from process No. 1 to process No. 8 (for example, in the transfer route between the manufacturing systems corresponding to process No. 1 and process No. 2), from process No. 9 to process No. 20 (for example, in the transfer route between the manufacturing systems corresponding to process No. 9 and process No. 10), from process No. 23 to process No. 24 (in the transfer route between the manufacturing systems corresponding to process No. 23 and process No. 24), and process No. 28 to process No. 30 (for example, in the transfer route between the manufacturing systems corresponding to process No. 28 and process No. 29), a normal AGV is used. In a transfer route between the manufacturing systems corresponding to process No. 8 and process No. 9, a contamination AGV for B doping is used. In transfer routes from process No. 20 to process No. 23 (for example, in the transfer route between the manufacturing systems corresponding to process No. 20 and process No. 21) and from process No. 24 to process No. 25. (in the transfer route between the manufacturing systems corresponding to process No. 24 and process No. 25), a contamination AGV for P doping is used. In transfer routes from process No. 25 to process No. 28 (for example, in the transfer route between the manufacturing systems corresponding to process No. 25 and process No. 26), a contamination AGV for a mixture of P doping and B doping is used.

With the data above, it is possible to select an AGV, control a transfer route, and select a carrier. Although the data of the process sheet is held in the host computer in the present embodiment, the present invention is not limited to the present embodiment. The data of the process sheet may be stored in a manufacturing system or a sub-computer.

Concerning the process sheet above, more information on a transfer (from which carrier to which carrier) may be used, in addition to the data of the change of carrier, to select a carrier.

In fact, there are plural process sheets, and it is necessary to select one form the plural process sheets in accordance with the corresponding lot. The selection of the process sheet may be conducted by the manufacturing system, the host computer, or the sub-computer.

In the case of the process sheet shown in FIG. 9, writing of an I.D. number with laser is conducted to a substrate. When the I.D. number of the substrate is used, it is possible to manage a lot by substrate. In the case, for example, of forming an I.D. number on a substrate with the use of a polycrystalline semiconductor film in pattering of the polycrystalline semiconductor film, however, each substrate is distinguished in combination with an I.D. number of a carrier and an address of a slot thereof in the previous processes.

In the present invention, air filtered through a filter is introduced into a containing portion of an AGV, and the air in the containing portion containing a carrier is exhausted after filtering the air through another filter. Accordingly, it is possible to reduce the amount of impurity contained in the exhaust air, and to prevent diffusion of the impurity in a transfer route.

In addition, an AGV used 1) after a process of doping and before a process of suppressing diffusion of an impurity to the atmosphere is different from that used 2) before the process of doping and 3) after the process of suppressing diffusion of the impurity to the atmosphere. Accordingly, it is possible to prevent a substrate at the stage 2) or 3) from being contaminated due to an impurity adhering to a containing portion of the AGV at the stage 1).

Besides, a carrier for storing a substrate at the stage 1) is different from that at the stage 2) or 3) in the present invention. Accordingly, contamination due to an impurity in a carrier can be prevented.

Furthermore, an AGV and a carrier can be surely managed when the CIM system is used in the present invention. Accordingly, since it is possible to prevent a substrate and a manufacturing system from being contaminated by an impurity, it is possible to suppress degradation in characteristics and yield of a semiconductor device due to chemical contamination and to get rid of the concern about a harmful influence on a human body due to the impurity.

What is claimed is:

1. An auto-guided vehicle comprising:
    a vehicle body comprising a space for containing a carrier for containing a substrate;
    first and second filters;
    a shutter; and
    a pump for introducing air into the space through the first filter and exhausting the air from the space through the second filter,
    wherein the space is separated from the outside when the shutter is closed.

2. An auto-guided vehicle according to claim 1, wherein each of the first and second filters is one of an ULPA filter and a HEPA filter.

3. An auto-guided vehicle according to claim 1, wherein the second filter is a filter including cation exchange fiber that is ion exchange fiber as a filter medium.

4. An auto-guided vehicle according to claim 1, wherein the first filter is provided above the second filter.

5. A production system for a semiconductor device, comprising:
    a host computer;
    at least first and second manufacturing systems;
    at least first and second carriers; and
    at least an auto-guided vehicle,
    wherein the auto-guided vehicle comprises:
        a vehicle body comprising a space for containing the second carrier;
        first and second filters;
        a shutter for separating the space from the outside with the shutter closed; and
        a pump for introducing air into the space through the first filter and exhausting the air from the space through the second filter, and
    wherein the host computer comprises:
        a means for storing as data at least a first step of using the auto-guided vehicle in a transfer route of a substrate between the first and second manufacturing systems, and at least a second step of moving the substrate from the first carrier used before a process to the second carrier used after the process in the first manufacturing system;
        a means for generating at least a first signal for ordering the auto-guided vehicle to transfer the substrate along the transfer route between the first and second manufacturing system; and
        a means for generating at least a second signal for ordering the first manufacturing system to move the substrate from the first carrier to the second carrier.

6. A production system for a semiconductor device, comprising:
    a host computer;
    at least first to third manufacturing systems;
    at least first and second carriers; and
    at least first and second auto-guided vehicles,
    wherein the first auto-guided vehicle comprises a first vehicle body comprising a first space for containing the first carrier,
    wherein the second auto-guided vehicle comprises:
        a second vehicle body comprising a second space for containing the second carrier;
        first and second filters;
        a shutter for separating the space from the outside with the shutter closed; and
        a pump for introducing air into the space through the first filter and exhausting the air from the space through the second filter, and
    wherein the host computer comprises:
        a means for storing as data a first step of using the second auto-guided vehicle in a first transfer route of a substrate between the first and second manufacturing systems, a second step of using the first auto-guided vehicle in a second transfer route of the substrate between the second and third manufacturing systems, and a third step of moving the substrate from the first carrier used before a first process to the second carrier used after the first process in the first manufacturing system and a fourth step of moving the substrate from the second carrier used before a second process to the first carrier used after the second process in the second manufacturing system;

a means for generating a first signal for ordering the second auto-guided vehicle to transfer the substrate along the first transfer route between the first and second manufacturing system and a second signal for ordering the first auto-guided vehicle to transfer the substrate along the second transfer route between the second and third manufacturing system; and a means for generating a third signal for ordering the first manufacturing system to move the substrate from the first carrier to the second carrier and a fourth signal for ordering the second manufacturing system to move the substrate from the second carrier to the first carrier.

7. A production system according to claim 5, wherein the first manufacturing system is a doping system.

8. A production system according to claim 6, wherein the first manufacturing system is a doping system.

9. A production system according to claim 5, wherein the second manufacturing system is a resist-stripping system.

10. A production system according to claim 6, wherein the second manufacturing system is a resist-stripping system.

11. A production system according to claim 5, wherein each of the first and second filters is one of an ULPA filter and a HEPA filter.

12. A production system according to claim 6, wherein each of the first and second filters is one of an ULPA filter and a HEPA filter.

13. A production system according to claim 5, wherein the second filter is a filter including cation exchange fiber that is ion exchange fiber as a filter medium.

14. A production system according to claim 6, wherein the second filter is a filter including cation exchange fiber that is ion exchange fiber as a filter medium.

15. A production system according to claim 5, wherein the first filter is provided above the second filter.

16. A production system according to claim 6, wherein the first filter is provided above the second filter.

17. A production management method for a semiconductor device, comprising;

controlling a first manufacturing system by a host computer to change a first carrier used before a first process to a second carrier used after the first process; and controlling an auto-guided vehicle by the host computer to transfer the second carrier along a route between first and second manufacturing systems;

wherein the auto-guided vehicle comprises first and second filters and a vehicle body comprising a space for containing the second carrier, wherein air is introduced into the space through the first filter; and the air is exhausted from the space through the second filter.

18. A production management method according to claim 17 further comprises controlling the second manufacturing system by the host computer to change the second carrier used before a second process to the first carrier used after the second process.

19. A production management method according to claim 17, wherein the first manufacturing system is a doping system.

20. A production management method according to claim 17, wherein the second manufacturing system is a resist-stripping system.

21. A production management method according to claim 17, wherein each of the first and second filters is one of an ULPA filter and a HEPA filter.

22. A production management method according to claim 17, wherein the second filter is a filter including cation exchange fiber that is ion exchange fiber as a filter medium.

23. A production management method according to claim 17, wherein the first filter is provided above the second filter.

24. An auto-guided vehicle comprising:

a vehicle body comprising a space for containing a carrier for containing a substrate;

first and second filters;

a shutter; and a pump for introducing air into the space through the first filter and exhausting the air from the space through the second filter, wherein the space is separated from the outside when the shutter is closed, wherein the first filter is provided above an exhaust outlet and the second filter, wherein the second filter is provided near the exhaust outlet, and wherein the pump is provided near the exhaust outlet.

25. An auto-guided vehicle according to claim 24, wherein each of the first and second filters is one of an ULPA filter and a HEPA filter.

26. An auto-guided vehicle according to claim 24, wherein the second filter is a filter including cation exchange fiber that is ion exchange fiber as a filter medium.

* * * * *